(12) United States Patent
Pangrle et al.

(10) Patent No.: US 6,784,095 B1
(45) Date of Patent: Aug. 31, 2004

(54) PHOSPHINE TREATMENT OF LOW DIELECTRIC CONSTANT MATERIALS IN SEMICONDUCTOR DEVICE MANUFACTURING

(75) Inventors: Suzette K. Pangrle, Cupertino, CA (US); Minh Van Ngo, Fremont, CA (US); Dawn Hopper, San Jose, CA (US); Lu You, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/073,066

(22) Filed: Feb. 12, 2002

Related U.S. Application Data
(60) Provisional application No. 60/268,423, filed on Feb. 14, 2001.

(51) Int. Cl.[7] .......................... H01L 21/4767
(52) U.S. Cl. .................. 438/637; 438/639; 438/788
(58) Field of Search ................. 438/624–629, 438/631, 633, 637–640, 642–645, 648, 687–688, 668–669, 672–675, 787–790

(56) References Cited

U.S. PATENT DOCUMENTS

| | | | |
|---|---|---|---|
| 5,472,825 A | 12/1995 | Sayka | |
| 5,536,681 A | 7/1996 | Jang et al. | |
| 5,614,279 A | 3/1997 | Kuwamoto et al. | |
| 5,726,090 A | 3/1998 | Jang et al. | |
| 6,133,137 A | * 10/2000 | Usami | 438/622 |
| 6,133,619 A | 10/2000 | Sahota et al. | |
| 6,140,252 A | 10/2000 | Cho et al. | |
| 6,143,641 A | 11/2000 | Kitch | |
| 6,143,670 A | 11/2000 | Cheng et al. | |
| 6,150,286 A | 11/2000 | Sun et al. | |
| 6,153,507 A | * 11/2000 | Mikagi | 438/618 |
| 6,376,876 B1 | * 4/2002 | Shin et al. | 257/315 |

* cited by examiner

*Primary Examiner*—Thanh Nguyen
(74) *Attorney, Agent, or Firm*—McDermott Will & Emery LLP

(57) ABSTRACT

Improved dielectric layers are formed by surface treating the dielectric layer with a phosphine plasma prior to forming a barrier layer thereon. Embodiments include forming a trench in a low k dielectric layer and modifying the side surfaces of the trench by subjecting the dielectric to a phosphine plasma produced in PECVD chamber. A conductive feature is formed by depositing a conformal barrier layer on the low k dielectric including the treated side surfaces of the dielectric and depositing a copper containing layer within the trench.

14 Claims, 1 Drawing Sheet

PHOSPHINE TREATMENT OF LOW DIELECTRIC CONSTANT MATERIALS IN SEMICONDUCTOR DEVICE MANUFACTURING

CROSS-REFERENCE TO RELATED APPLICATIONS

This application claims priority from provisional patent application Ser. No. 60/268,423 filed Feb. 14, 2001, entitled "PHOSPHINE PLASMA TREATMENT OF LOW DIELECTRIC CONSTANT MATERIALS IN SEMICONDUCTOR DEVICE MANUFACTURING" the entire disclosure of which is herein incorporated by reference.

This application contains subject matter similar to subject matter disclosed in co-pending U.S. patent application Ser. No. 10/073,067, filed on 12 Feb. 2002; Ser. No. 10/073,068, filed on 12 Feb. 2002; and Ser. No. 10/073,052, filed on 12 Feb. 2002.

FIELD OF THE INVENTION

The present invention relates to treating a low dielectric constant layer suitable for use in semiconductor devices. The present invention has particular applicability to the formation of interlevel dielectric layers in multilevel semiconductor devices.

BACKGROUND OF THE INVENTION

The escalating requirements for high density and performance associated with ultra-large scale integration semiconductor devices necessitate design features of 0.18 micron and under, increased transistor and circuit speeds, high reliability, and increased manufacturing throughput. The reduction of design features to 0.18 micron and under challenges the limitations of conventional interconnection technology, such as the electrical isolation properties of interlevel dielectric (ILD) materials.

A problem encountered in highly miniaturized semiconductor devices employing multiple levels and reduced interwiring spacings in both the horizontal and vertical dimensions is related to the resistance-capacitance (RC) time constant of the system. Although semiconductor devices are presently being scaled in the horizontal dimension, they are not generally scaled in the vertical dimension, since scaling in both dimensions would lead to a higher current density that could exceed reliability limits. Horizontal scaling, however, requires conductive lines having a high aspect ratio, i.e., ratios of conductor height to conductor width greater than one, e.g., three or four, along with reduced interwiring spacings. As a consequence, capacitive coupling between conductive lines becomes a significant limitation on circuit speed. If intrametal capacitance is high, electrical inefficiencies and inaccuracies increase. It has been recognized that a reduction in capacitance within multi-level system will reduce the RC time constant between the conductive lines.

The drive towards increased miniaturization and the resultant increase in the RC time constant have served as an impetus for the development of newer, low dielectric constant ("low k") materials as substitutes for conventional higher dielectric constant silicon oxide-based ILD materials. However, such dielectric materials must be able to serve a number of different purposes requiring diverse characteristics and attributes. For example, the ILD material must form adherent films that: prevent unwanted shorting of neighboring conductors or conducting levels by acting as a rigid, insulating spacer; prevent corrosion and/or oxidation of metal conductors, by acting as a barrier to moisture and mobile ions; fill deep, narrow gaps between closely spaced conductors; and undergo planarization of uneven surface topography so that a relatively flat level of conductors can be reliably deposited thereon. Another, and important consideration in regard to RC time constant effects, is that such dielectric films used as ILD materials must have a low dielectric constant, as compared to the value of 4.1 to 3.9 for a conventionally employed silicon dioxide ($SiO_2$) layer, in order to reduce the RC time constant, lower power consumption, reduce crosstalk, and reduce signal delay in closely spaced conductors.

Silicon oxide has found the widest application as ILD layers in multilevel interconnect technology partly because of the familiarity and varied methods for depositing silicon oxide layers pervasive in semiconductor manufacturing processes. Silicon oxide as ILD layers can be deposited by any number of processes, including chemical vapor deposition (CVD), plasma enhanced CVD and liquid spin-on glass forming techniques, tailored to achieving high-quality ILDs characterized by good electrical and physical properties.

Increasing attention has focused on the use of low k dielectrics, such as porous silicon dioxides in combination with copper metallization to reduce feature size, increase circuit density and improve device performance. However, the use of such copper/silicon oxide composite structures is not without problems. Copper is known to have a relatively large diffusion coefficient into silicon oxide and silicon and the propensity of copper ions to diffuse or migrate into such materials adversely affects their dielectric strength. For this reason, copper and copper alloys are typically encapsulated by at least one diffusion barrier to prevent diffusion of the copper and/or copper ions into silicon oxide layers. Use of barrier layers, however, further reduces the shrinking space available for patterned metallization and conductive features and increases the need for improved dielectric materials separating the conductive features.

Additional difficulties in the employment of low k materials lie in the surface properties of the low k dielectric layer. For example, it has been observed that, under certain circumstances, adding a protective capping layer on a low k dielectric layer results in poor adhesion. It has been also observed that applying the capping layer by conventional plasma deposition techniques can cause an underlying low k layer, particularly a porous dielectric underlayer, to degrade due to the oxidation attendant during the formation of the capping layer. The degradation is due to bond breaking and loss of hydrogen and/or methyl groups in contained in such materials when oxygen or oxygen radicals react with the surface of an underlying low k layer.

Thus, there exists a need for utilizing current techniques of forming ILD layers having low dielectric constants that have improved surface properties for improved adhesion and improved resistance to metal contamination, particularly as employed in the manufacture of ultra large scale integration semiconductor devices having multiple levels.

DISCLOSURE OF THE INVENTION

An advantage of the present invention is a semiconductor device having a low k material with improved surface properties including resistance to degradation, improved adhesion to subsequently applied layers thereon and improved resistance to metal contamination.

Additional advantages, and other features of the present invention will be set forth in the description which follows and in part will become apparent to those having ordinary skill in the art upon examination of the following or may be learned from the practice of the present invention. The advantages may be realized and obtained as particularly pointed out in the appended claims.

According to the present invention, the foregoing and other advantages are achieved in part by a method of forming a composite dielectric on a semiconductor substrate. The composite dielectric comprises a first dielectric, e.g. a low k dielectric such as a porous silicon oxide, and a cap layer, e.g. a silicon nitride or silicon oxynitride, over the low k dielectric. The method comprises: forming a dielectric layer having an exposed surface on the substrate; subjecting the dielectric layer to phosphine gas and/or a phosphine plasma to treat the exposed surface thereof; and forming a cap layer directly on the treated surface of the dielectric layer.

The present method provides for introducing the substrate to a plasma enhanced chemical vapor deposition (PECVD) chamber having a phosphine source to subject the exposed surface of the dielectric layer to the phosphine and/or phosphine plasma and forming the cap layer by PECVD. Advantageously, the present invention contemplates that the phosphine plasma treatment and cap formation can be carried out in the same PECVD chamber by sequential steps thereby minimizing process steps, contamination and process variation.

The side surfaces, after etching the dielectric layer, can also enjoy the benefit of the present invention. In an embodiment of the present invention, a photoresist is deposited and patterned on a cap layer followed by etching through the cap and dielectric layers to expose side surfaces on the cap and dielectric layers. The exposed side surfaces of the dielectric layer are then subject to a phosphine plasma to improve the surface properties thereof.

Another aspect of the present invention is a method of treating a dielectric layer on a semiconductor substrate. The present invention contemplates forming a dielectric layer on a semiconductor substrate, such as a substrate that includes a single crystal silicon substrate having at least one active device region formed therein or thereon. The method comprises: forming a dielectric layer on the substrate; forming a patterned photoresist on the dielectric layer; etching through the dielectric layer to expose side surfaces therein; and subjecting the side surfaces of the dielectric layer to a phosphine plasma.

Embodiments include removing the photoresist layer; forming a conformal barrier layer on the dielectric layer including the phosphine plasma treated side surfaces thereof; forming a conductive layer on the conformal barrier layer and within the etched dielectric layer; annealing the conductive layer; polishing the conductive layer and continuing through to the barrier layer to form a conductive trench or plug within the dielectric layer; and forming a cap layer over the conductive layer and barrier layer.

Additional advantages of the present invention will become readily apparent to those skilled in this art from the following detailed description, wherein only the preferred embodiments of the present invention are shown and described, simply by way of illustration but not limitation. As will be realized, the invention is capable of other and different embodiments, and its several details are capable of modification in various obvious respects, all without departing from the spirit of the present invention. Accordingly, the drawings and description are to be regarded as illustrative in nature, and not as restrictive.

BRIEF DESCRIPTION OF THE DRAWINGS

The following detailed description of the embodiments of the invention can best be understood when read in conjunction with the following drawing, wherein.

DESCRIPTION OF THE INVENTION

The present invention stems from the discovery that the surface properties of a low k material useful in semiconductor fabrication, e.g. a porous silicon based dielectric material, can be improved by exposing the surfaces of the low k dielectric layer to phosphine and/or a plasma containing a phosphine source. The present invention thus provides methods for modifying the surface of a dielectric layer, e.g. a low k dielectric layer composed of silicon, and has utility in the fabrication of integrated semiconductor devices.

It has been discovered that by modifying the surface of the low k layer prior to the deposition of an additional layer thereon, that the adhesion of the added layer can be improved. Further, it has been discovered that by treating the surface of a low k layer in accordance with the present invention the treated underlying dielectric has improved barrier properties that minimizes metal migration therein.

In accordance with the present invention, the improvement in the surface properties is carried out by subjecting a surface of the low k dielectric to a phosphine plasma, e.g. a plasma generated in a PECVD chamber by introducing phosphine with or without a carrier gas, such as argon or mixtures thereof. It is believed that exposing the low k dielectric layer to a plasma containing phosphine produces a phosphorus silicate which is known to getter metals and metal ions, such as copper. Additional benefits can be achieved by introducing boron hydrides.

Figure 1:
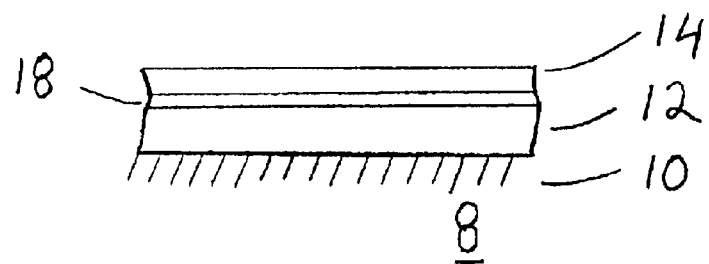
FIG. 1 is a cross-sectional view schematically illustrating a composite structure according to the present invention.

The present invention advantageously exploits the low resistivity property of a low k dielectric layer to electrically isolate devices or to define non-conductive boundaries, such as interlevel dielectric layers, while improving the surface properties of the low k layer and minimizing the thickness needed for a barrier layer to encapsulate a conductive feature. An embodiment of the present invention is illustrated in FIG. 1. Shown therein is a cross-sectional schematic view of a composite dielectric structure on semiconductor substrate 10. Semiconductor substrate 10 typically comprises monocrystalline silicon, with conductive contacts formed therein for electrical connection with at least one active region formed in (8) or on the substrate, such as a source/drain region of a transistor (not shown for illustrative convenience). Substrate 10 can also include one or more premetal interconnects to electrically connect the transistor to the interconnect. The top of the premetal dielectric is capped with a dielectric barrier (also not shown for illustrative convenience). In accordance with the present invention, a low k layer 12 overlays substrate 10 and a second dielectric layer, e.g. a capping layer, 14 overlays dielectric 12. In accordance with the present invention, the interface 18 between low k layer 12 and capping layer 14 has been treated by a phosphine plasma prior to forming the capping layer to improve the adhesion between the layers.

Low k layer 12 can be a silsesquioxane spin-on-glass (SOG) dielectric material including derivatives thereof, such as hydrogen silsesquioxane (HSQ), organic doped silsesquioxane or silica glasses (OSG), carbon bonded fluorocarbon silsesquioxane (FSQ), fluorine doped silica dielectric materials and porous versions of the above or porous organics. Such low k dielectric materials are desirable within the art of microelectronics fabrication due in part to the ease of fabrication of dielectric layers by spin-on methods or by CVD methods, and the resulting low dielectric constant of the dielectric layers, which typically exhibit homogeneous dielectric constant values ranging from about 1.6 to about 3.3.

In practicing the present invention, the exposed surface of the low k dielectric is treated by plasma enhanced chemical vapor deposition (PECVD) prior to forming the capping layer. In an embodiment of the present invention, substrate 10 having low k layer 12 thereon is introduced to a PECVD chamber. PECVD systems are commercially available as, for example a Producer System from Applied Materials of Santa Clara, Calif.

In an exemplary embodiment, a OSG dielectric layer is formed on the substrate by a PECVD process having a thickness of about 3500 Å. The upper surface thereof is then treated using PECVD with phosphine gas at a flow rate of about 50 sccm to about 500 sccm. A power is applied to the chamber at about 100 watts to about 500 watts. The pressure of the chamber is about 1 torr to about 6 torr and the temperature is adjusted to approximately 400° C. In practicing the present embodiment,the substrate is positioned at a distance of approximately 50 to 800 mils from the showerhead. It is expected that phosphine plasma treatment according to the present embodiment will form an increased amount of silicon-hydrogen species at the interface. It is believed that plasma treating the surface to affect a thickness of about 10 Å to about 100 Å of the low k dielectric and will substantially improve the surface properties of the low k layer, such as promote adhesion of a subsequently applied capping layer.

After modifying the surface properties of the low k layer, a capping layer is formed on the dielectric layer, such as a silicon dioxide film formed by plasma enhanced TEOS (PETEOS). In other forms, the capping layer can be silicon nitride, silicon oxynitride, silicon carbide or, composites thereof, and the like. In an embodiment of the present invention, the capping layer is formed in-situ in the PECVD system after treating the surface of the low k layer, such as an oxide capping layer formed by a silane. The phosphine plasma treated surface of the low k layer according to the present invention advantageously prevents or minimizes metal contamination typically observed in copper metallization employing silicon oxide insulators.

Figure 2:
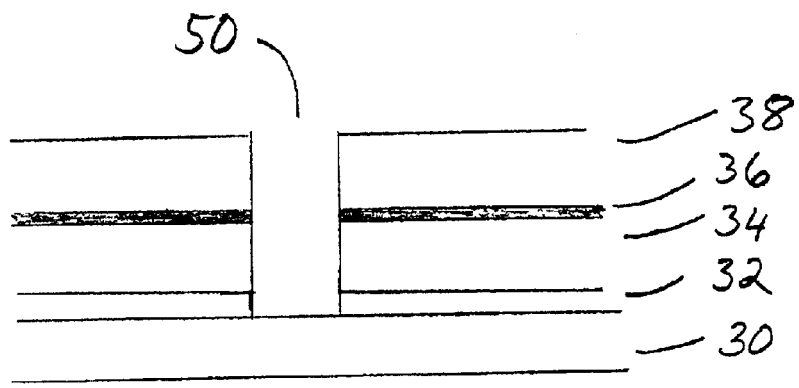
FIGS. 2–3 schematically illustrate cross-sectional views of a composite structure including a treated dielectric layer in accordance with the present invention.
Figure 3:
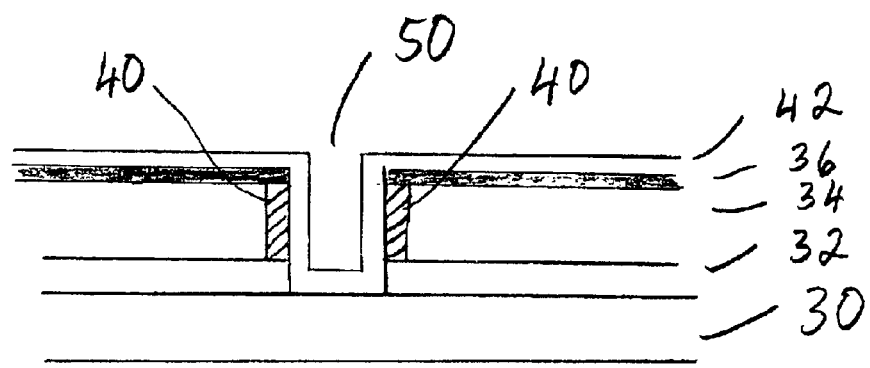

In accordance with the embodiments of FIGS. 2–3, the present invention provides methods of treating a dielectric layer on a semiconductor substrate in the formation of interlevel dielectrics composites comprising a low k interlevel layer and at least one conductive feature. Interconnection structures typically have a first layer of metallization, comprising a conductive pattern and interwiring spaces, a second level of metallization, and frequently third and subsequent levels of metallization. Interlevel dielectrics, such as a OSG, are used to electrically isolate the different levels of metallization in a silicon substrate. Typically, conductive patterns on different layers, i.e. upper and lower layers, are electrically connected by a conductive plug filling a via hole, while a conductive metal filling a contact hole establishes electrical contact with an active region on a semiconductor substrate, such as a source/drain region. Conductive lines are formed in trenches, which typically extend substantially horizontal with respect to the semiconductor substrate. Semiconductor "chips" comprising five or more levels of metallization are becoming more prevalent as device geometries shrink to submicron levels.

Referring to FIG. 2, a composite structure prior to metal deposition is shown having base layer 30 on a semiconductor substrate (not shown), barrier film 32 on base layer 30, a low k layer 34 on barrier film 32 and a cap layer 36 over low k layer 34. In very large scale inter-circuit applications, base layer 30 can include several thousand openings which can be either vias or lateral metallization lines where the metallization pattern serves to interconnect structures on or in the semiconductor substrate (not shown for illustrative convenience). Barrier film 32 can have a thickness of about 200–500 Å and typically includes materials selected from the group consisting of silicon nitride, silicon oxynitride, silicon carbide, etc. Low k dielectric 34 can be formed by a PECVD process depositing an OSG film from trimethylsilane. Alternatively, a low dielectric layer can be formed by liquid spin-on oxide forming techniques. In an embodiment of the present invention, low k dielectric layer 34 is deposited by PECVD.

In accordance with fabricating a metal feature, a patterned photoresist layer 38 is formed on cap layer 36. The patterned photoresist can be formed by applying a conventional photoresist to cap layer 36 and patterned using photolithographic masking and developing techniques to form a desired pattern that can be transferred to underlayers 36, 34 and 32 employing conventional etching techniques to etch opening or trench 50 in the dielectric layers exposing side surfaces thereof and stopping on base layer 30. The photoresist layer can then be stripped to expose the upper surface of cap layer 36. In practicing the present invention, the etched low k dielectric layer having exposed side surfaces is subjected to a phosphine plasma, as by introducing the composite structure to a PECVD chamber containing phosphine, with or without a carrier gas, such as argon, to modify the side surfaces 40. As shown in FIG. 3, barrier film 42 can be a conformal film covering the surfaces of the composite including the bottom of base layer 30, the treated side surfaces 40 of dielectric layer 34 and the upper surface of dielectric 34. In an alternative embodiment, the upper surface of dielectric 34 can be modified before applying the patterned photoresist layer and/or after stripping the photoresist layer.

The enhanced barrier properties of the low k dielectric advantageously permits the use of a thinner barrier film. In an embodiment of the present invention, barrier film 42 can have a thickness of about 50–500 Å. Barrier film 42 can be a film comprising tantalum nitride, titanium nitride, titanium tungsten, tantalum, titanium, tantalum silicon nitride, tungsten nitride, alloys of these materials, composites thereof, etc. and can be deposited by PVD, CVD, ALCVD and can be deposited in-situ.

A conductive layer can then be formed in trench 50 by depositing a conductive layer over barrier layer 42. Typical conductive materials that can be used in the present invention include metals, such as aluminum, copper, titanium, binary alloys, ternary alloys, such as Al—Pd—Cu, Al—Pd—Nb, Al—Cu—Si or other similar low resistivity metal or metal based alloys. In an embodiment of the present invention, the conductive layer comprises copper.

The conductive layer can function to interconnect active regions on or in the semiconductor substrate by providing electrical contact with the substrate (or active regions thereon) through connection holes as, for example via holes, and is formed in low k dielectric layer 34 with predetermined spaces between conductive lines. The low k layer can be an interlevel dielectric layer, which provides electrical isolation between conductive areas and further getters copper and its ions thereby minimizing the thickness needed for the barrier film.

The conductive layer can then be annealed as by heating the substrate up to about 450° C. The surface of the conductive layer can then be planarized by conventional etching or chemical-mechanical polishing (CMP) techniques to the barrier layer. Because many ultra large scale integration devices presently manufactured are very complex and require multiple levels of metalization for interconnections, it has been common to repeat the above-described dielectric-conductive layer formation process multiple times, e.g., to form third, four, fifth, or more conductive levels interconnected by conductive vias, each conductive level of metalization separated by at least one layer of a phosphine plasma treated surface of a dielectric layer.

The present invention enjoys particular applicability in manufacturing multilevel semiconductor devices, notably in forming low dielectric constant ILD layers having improved barrier properties. The present invention is applicable to various phases of semiconductor manufacturing wherein an interconnect metallization pattern is formed including surface treated ILD layers, particularly an interconnect metallization pattern having 0.18 $\mu$ geometry and under. Such patterns comprise, for example, the formation of copper and copper alloy interconnections on or within dielectric layers having surfaces treated by a phosphine plasma.

Only the preferred embodiment of the present invention and an example of its versatility is shown and described in the present disclosure. It is to be understood that the present invention is capable of use in various other combinations and environments and is capable of changes or modifications within the scope of the inventive concept as expressed herein.

What is claimed is:

1. A method of forming a composite dielectric on a semiconductor substrate, the method comprising:

forming a low k dielectric layer having an exposed surface on the substrate;

treating the exposed surface of the dielectric layer with phosphine and/or a phosphine plasma; and forming a cap layer directly on the treated surface of the dielectric layer, wherein the cap layer is a dielectric and formed in-situ after treating the exposed surface of the dielectric layer.

2. The method of claim 1, comprising forming the dielectric by spin-on-glass techniques.

3. The method of claim 1, comprising introducing the substrate to a plasma enhanced chemical vapor deposition (PECVD) chamber having a phosphine source to treat the exposed surface of the dielectric layer.

4. The method of claim 3, comprising introducing phosphine together with a carrier gas to the PECVD chamber as the phosphine source.

5. The method of claim 3, wherein the cap layer is selected from the group consisting of silicon nitride, silicon oxynitride, silicon carbide and composites thereof.

6. The method of claim 1, comprising patterning a photoresist on the cap layer and etching through the cap and dielectric layers to expose side surfaces of the cap and dielectric layers.

7. The method of claim 6, comprising subjecting the exposed side surfaces of the cap and dielectric layers to a phosphine plasma.

8. The method of claim 1, comprising forming the dielectric layer from a silsesquioxane dielectric material or derivative thereof.

9. The method of claim 6, comprising
   removing the photoresist layer; and
   forming a conformal barrier layer on the dielectric layer including the phosphine plasma treated side surfaces thereof.

10. The method of claim 9, comprising forming a conductive layer comprising copper on the conformal barrier layer and within the etched dielectric layer.

11. The method of claim 10, comprising polishing the conductive layer to the barrier layer to form a conductive trench or plug within the dielectric layer.

12. The method according to claim 11, comprising forming a cap layer over the conductive layer and barrier layer.

13. The method according to claim 1, wherein the dielectric layer comprises a porous silicon oxide.

14. The method of claim 13, comprising depositing the silicon oxide at a thickness of about 0.3 microns to about 1 micron.

* * * * *